United States Patent
Suzuki (10) Patent No.: US 6,530,419 B1
(45) Date of Patent: Mar. 11, 2003

(54) COOLING SYSTEM FOR ELECTRONIC PACKAGES

(75) Inventor: Masahiro Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/605,846

(22) Filed: Jun. 29, 2000

Related U.S. Application Data (62) Division of application No. 08/824,971, filed on Mar. 27, 1997, now Pat. No. 6,105,662.

(51) Int. Cl.⁷ .................................................. F28F 7/00
(52) U.S. Cl. ........................... 165/80.3; 165/104.33; 165/46; 361/687; 361/700; 257/715; 174/15.2
(58) Field of Search ........................... 165/80.3, 104.33, 165/140, 144, 121, 46, 185, 80.4, 104.14; 361/700, 687, 697, 704; 257/722, 714, 715, 713; 174/15.2, 16.3

(56) References Cited

U.S. PATENT DOCUMENTS

| | | | |
|---|---|---|---|
| 3,604,504 A | 9/1971 | Kessler, Jr. | |
| 4,138,692 A | 2/1979 | Meeker et al. | |
| 5,159,529 A | 10/1992 | Lovgren et al. | |
| 5,213,153 A | 5/1993 | Itoh | |
| 5,285,347 A | 2/1994 | Fox et al. | |
| 5,421,402 A | 6/1995 | Lin | |
| 5,441,102 A | 8/1995 | Burward-Hoy | |
| 5,549,155 A | 8/1996 | Meyer, IV et al. | |
| 5,634,351 A | 6/1997 | Larson et al. | |
| 5,646,824 A | 7/1997 | Ohashi et al. | |
| 5,690,468 A * | 11/1997 | Hong | 165/121 X |
| 5,731,954 A | 3/1998 | Cheon | |
| 5,764,483 A | 6/1998 | Ohashi et al. | |
| 5,781,409 A | 7/1998 | Mercredy, III | |
| 5,822,187 A | 10/1998 | Garner et al. | |
| 5,842,514 A * | 12/1998 | Zapach et al. | 165/104.33 |
| 5,905,635 A * | 5/1999 | Drevon et al. | 165/104.33 |
| 6,029,742 A * | 2/2000 | Burward-Hoy | 165/80.3 |
| 6,041,850 A * | 3/2000 | Esser et al. | 165/104.33 |

FOREIGN PATENT DOCUMENTS

| | | |
|---|---|---|
| JP | 57-136354 | 8/1982 |
| JP | 60-50948 | 3/1985 |
| JP | 62-216299 | 9/1987 |
| JP | 1-152691 | 6/1989 |
| JP | 6-204-368 | 7/1994 |
| JP | 8-274480 | 10/1996 |
| JP | 8-274481 | 10/1996 |

* cited by examiner

*Primary Examiner*—Christopher Atkinson
(74) *Attorney, Agent, or Firm*—Staas & Halsey LLP (57) ABSTRACT

A cooling system for various electronic packages used in electronic equipment such as electronic computers, work stations, word processors, etc. and, particularly, a cooling system capable of efficiently cooling various electronic packages and, particularly, highly dense electronic packages used in electronic equipment without greatly limiting the freedom for designing the electronic equipment as a whole. The cooling system includes a heat radiator (40, 40', 40") installed in at least one independent holding portion formed in advance in a housing (30) of the electronic equipment, a heat conducting plate element (36) provided for at least one electronic package in said housing so as to receive heat therefrom, and a heat conducting passage element (38) laid down to conduct heat from the heat conducting plate element to a heat radiator.

23 Claims, 9 Drawing Sheets

COOLING SYSTEM FOR ELECTRONIC PACKAGES

This application is a divisional of application Ser. No. 08/824,971, filed Mar. 27, 1997, now U.S. Pat. No. 6,105,662 allowed.

BACKGROUND OF THE INVENTION

1. Field of the Invention

The present invention relates to a cooling system for a variety of electronic packages that are used in electronic equipment such as electronic computers, workstations, personal computers and the like.

2. Description of the Related Technology

As is well known, electronic equipment such as electronic computers, workstations, personal computers and the like are equipped with circuit boards on which are mounted a variety of electronic packages such as CPUs (central processing units) as represented by MPUs (microprocessor units) and MCMs (multi-chip modules). In recent years, the electronic packages are becoming more dense and, hence, generate more heat when they are in operation. It need not be pointed out that in order to guarantee proper operation of the electronic packages and to extend their life, it is necessary to suitably cool the electronic packages to maintain their temperatures to lie within predetermined ranges.

Figure 15A:
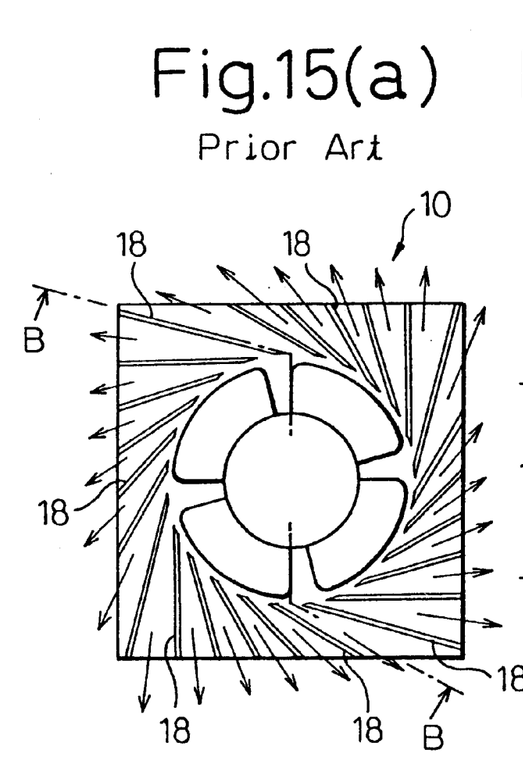
Figure 15B:
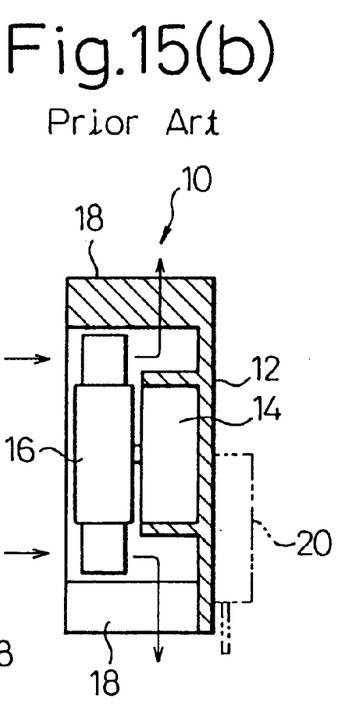
Figure 15C:
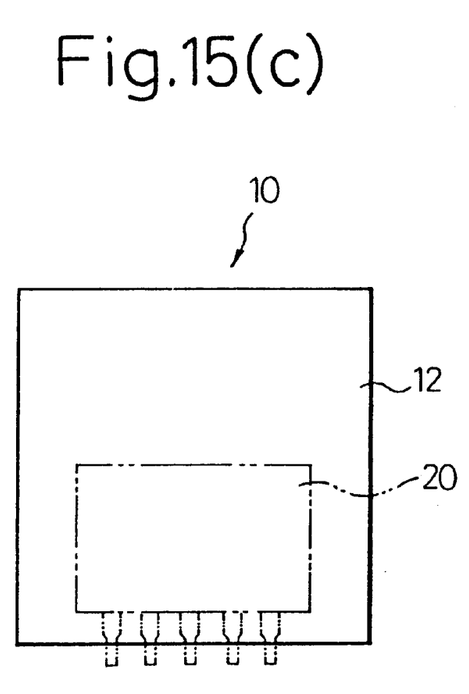

In order to cool the above-mentioned highly sophisticated electronic packages, it has heretofore been proposed to use, for example, a heat sink 10 with a cooling fan as shown in FIGS. 15(a), 15(b) and 15(c). The heat sink 10 with cooling fan comprises a heat sink plate 12, a small electric motor 14 mounted on the center of the heat sink plate 12, and a fan 16 attached to an output shaft of the small electric motor 14. Furthermore, a number of heat-radiating fins 18 are extending from the heat sink plate 12 and are nearly radially arranged so as to surround the fan 16. As will be obvious from FIGS. 15b and 15c, the heat sink 10 with cooling fan is directly attached to a highly dense electronic package 20. Upon driving the small electric motor 14, therefore, the highly sophisticated electronic package is efficiently cooled. That is, upon rotating the fan 16, an air flow is produced among the heat-radiating fins 18 as indicated by arrows in FIGS. 15(a) and 15(b), whereby the heat conducted to the heat-radiating fins 18 from the highly dense electronic package 20 through the heat sink plate 12 is efficiently radiated.

Figure 16:
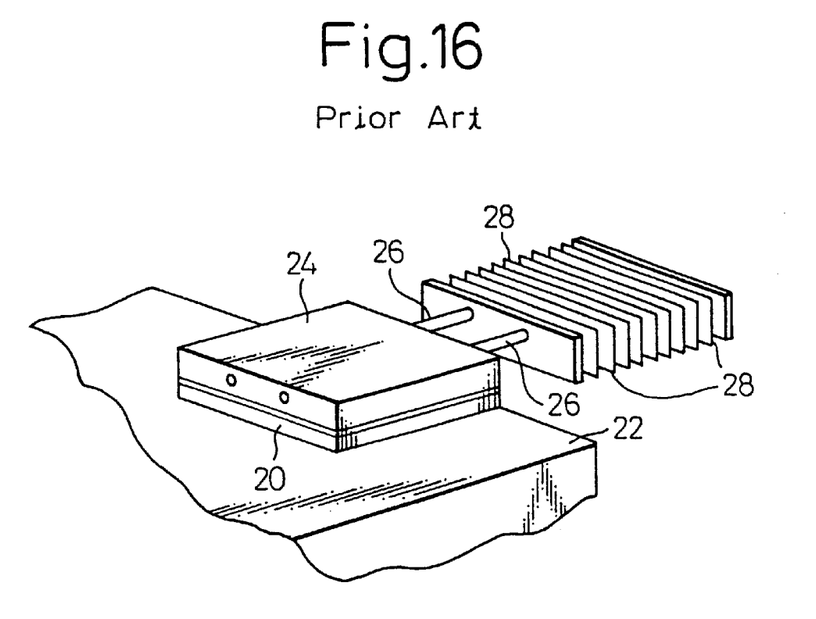
FIG. 16 is a perspective view illustrating another conventional cooling system for the electronic packages.

FIG. 16 illustrates another conventional cooling system in which a heat conducting plate element 24 is attached onto the highly dense electronic package 20 that is mounted on a circuit board 22. A pair of heat pipes 26 extend from the heat conducting plate element 24, and many heat-radiating fins 28 are attached to the ends of the pair of heat pipes 26. According to the prior art, the heat is efficiently conducted from the heat conducting plate element 24 to the heat-radiating fins 28 through the heat pipes 26, and the highly dense electronic package 20 is favorably cooled.

It has been pointed out that the conventional cooling system shown in FIGS. 15(a), 15(b) and 15(c) has a problem in that the heat sink with cooling fan is itself bulky. For example, the junction temperature of a highly dense electronic package (MPU: microprocessor unit) having a square shape of a side of about 4 cm that generates 15 watts of heat can be lowered to be not higher than 85° C. at an ambient temperature of 40° C. When the heat is generated in further increased amounts, however, the heat sink with cooling fan of a larger size must be employed to guarantee the operation of the MPU maintaining a temperature of 85° C. In the vicinities of a place where the highly dense electronic package is mounted, however, no space is available for installing such a large heat sink with cooling fan. In order to cope with an increased amount of heat without using the heat sink of a large size, it can be contrived to employ a liquid cooling system requiring, however, conduits and coolant feeding device resulting in a considerable increase in the cost for cooling.

The conventional cooling system of the type shown in FIG. 16 has a problem in that a forced air cooling is necessary to assist the radiation of large amounts of heat from the heat-radiating fins and that the cooling fan must be provided separately from the cooling system. When the housing of an electronic equipment is provided with a cooling fan for forced air cooling, the place for installation must be determined in relation to a place where the heat-radiating fins are formed, imposing a limitation on the freedom for designing the electronic equipment as a whole. There also arise problems in that there is no freedom in the combination of the cooling fan and the heat-radiating fins, it is not easy to improve the conduction of heat through the fins, and the heat-radiating fins themselves must be formed in a large size. So far, no particular attention has been given to space for laying out the heat pipes and heat-radiating fins in the housing.

SUMMARY OF THE INVENTION

The object of the present invention is therefore to provide a system which is capable of efficiently cooling a variety of electronic packages and, particularly, highly sophisticated electronic packages that are used in the electronic equipment without greatly limiting the freedom for designing the electronic equipment as a whole.

According to the present invention, a cooling system comprises at least one independent heat radiator-holding portion formed in advance in a housing of an electronic equipment, a heat radiator installed in said heat radiator-holding portion, a heat conducting plate element provided for at least one electronic package in said housing so as to receive heat therefrom, and a heat conducting passage element (e.g., a heat pipe) which is connected at its one end to said heat conducting plate element and is connected at its other end to said heat radiator so that heat is conducted from the heat conducting plate element to said heat radiator.

It is desired that the heat radiator includes a number of heat-radiating fins provided at the other end of the heat conducting passage element. It is further desired that the heat radiator has a cooling fan for cooling said number of heat-radiating fins.

The heat radiator comprises a second heat conducting plate element connected to the other end of said heat conducting passage element (e.g., a heat pipe), heat-radiating pin elements extending from both sides of said second heat conducting plate element, and cooling fans provided on both sides of said second heat conducting plate element. Otherwise, the heat radiator comprises the second heat conducting plate element connected to the other end of said heat conducting passage element, and a cold plate secured to the second heat conducting plate element.

It is desired that the heat conducting passage element is at least partly formed as a bellows.

According to another aspect of the present invention, there is provided a cooling system for electronic packages, comprising a plurality of independent heat radiator-holding portions formed in advance along the outer circumference of a housing of an electronic equipment, a plurality of heat radiators installed in said heat radiator-holding portions, a heat conducting plate element provided for at least one electronic package in said housing so as to receive heat therefrom, and a plurality of heat conducting passage elements (e.g., heat pipes) which are connected at their ends on one side thereof to said heat conducting plate element and are connected at their ends on the other side thereof to said heat radiators so that heat is conducted from the heat conducting plate element to said plurality of heat radiators.

The first heat conducting plate element provided for the electronic package is connected to a relay heat conducting plate element through a second heat conducting passage element, and the heat conducting passage elements extending from the first heat conducting plate element and from said relay heat conducting element are connected to the heat radiators. Otherwise, the first heat conducting plate element provided for the electronic package is connected to a relay heat conducting block element through the second heat conducting passage element, and the heat conducting passage elements extending from the first heat conducting plate element and the relay heat conducting block element are connected to the heat radiators.

According to a further aspect of the present invention, there is provided a cooling system for electronic packages comprising at least one independent heat radiator-holding portion formed in advance in a housing of an electronic equipment, a heat radiator installed in said heat radiator-holding portion, a plurality of heat conducting plate elements provided for a plurality of electronic packages arranged in said housing so as to receive heat therefrom, a plurality of first heat conducting passage elements which are connected at their ends on one side thereof to said heat conducting plate elements and are connected at their ends on the other side thereof to said heat radiator so that heat is conducted from said plurality of heat conducting plate elements to said heat radiator, and second heat conducting passage elements for connecting said plurality of heat-conducting plate elements to each other.

According to the present invention, as will be obvious from the above-mentioned constitution, the heat radiator is installed in at least one independent holding place formed in advance in the housing of the electronic equipment and, hence, the heat-radiating capacity of the heat radiator can be freely selected depending upon the holding place.

BRIEF DESCRIPTION OF THE DRAWINGS

FIG. 15($a$) is a top plan view illustrating a conventional system for the electronic packages, FIG. 15($b$) is a sectional view along the line 15($b$)—15($b$) of FIG. 15($a$), and FIG. 15($c$) is a bottom plan view of the structure of FIG. 15($a$)

BEST MODE FOR CARRYING OUT THE INVENTION

Embodiments of the cooling system of the present invention will now be described with reference to FIGS. 1 to 14 of the accompanying drawings.

Figure 1:
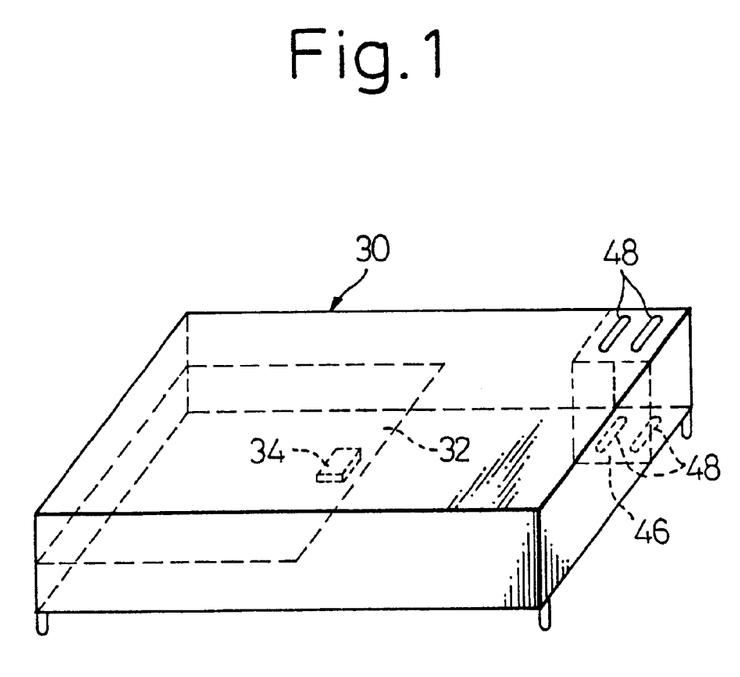
FIG. 1 is a perspective view schematically illustrating a housing of an electronic equipment which employs a cooling system of the present invention.
Figure 2:
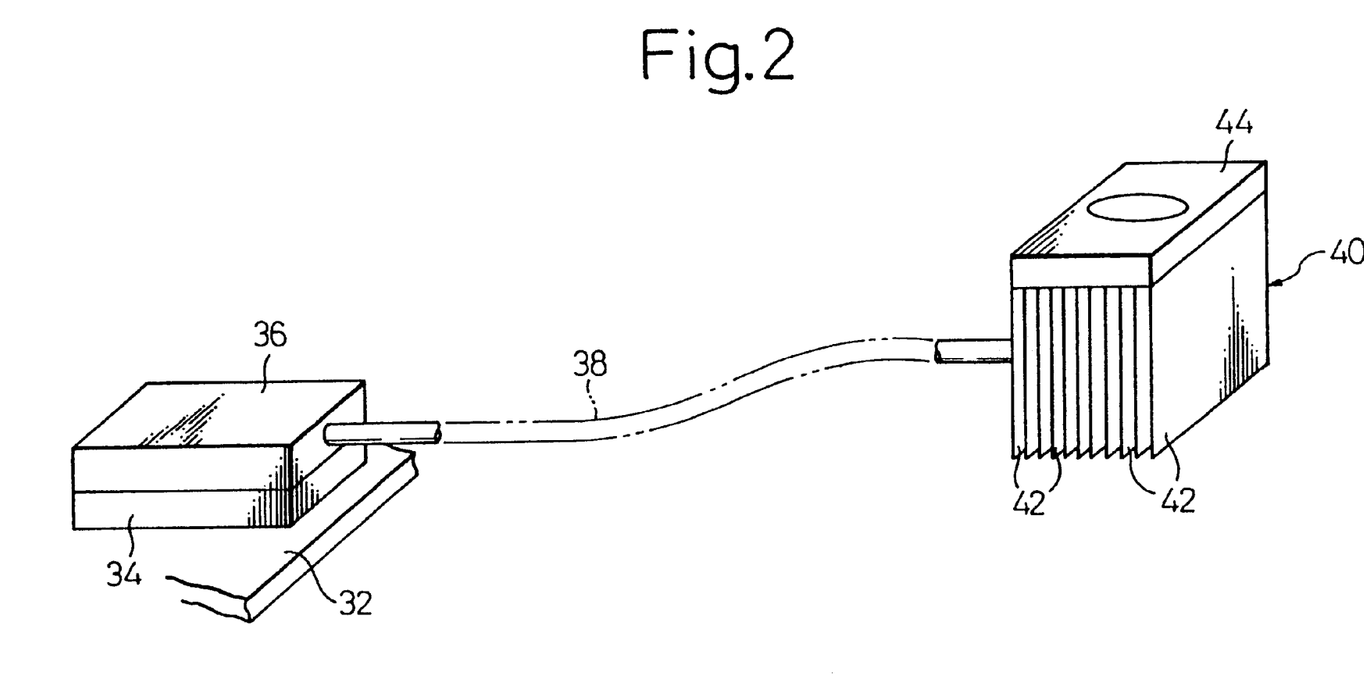
FIG. 2 is a perspective view schematically illustrating a cooling system constituted according to an embodiment of the present invention, which will be introduced into the housing shown in FIG. 1.

FIG. 1 schematically illustrates the whole electronic equipment. A main circuit board 32 is provided in a housing 30 of the electronic equipment. Though FIG. 1 representatively shows the main circuit board 32, the housing 30 may contain any other constituent parts such as power source circuit board and the like circuit boards. A variety of electronic parts are mounted on the main circuit board 32 and among them, a highly dense electronic package is denoted by reference numeral 34. According to the present invention as shown in FIG. 2, a heat conducting plate element 36 is attached to the highly sophisticated electronic package 34, the heat conducting plate element 36 being made of a highly heat conducting metal such as copper, brass, aluminum, etc. The heat conducting plate element 36 is preferably attached to the highly dense electronic package 34 by using an adhesive or a filler such as a thermal compound having good thermal conductivity. The heat conducting plate element 36 is connected to a heat radiator 40 through a suitable heat conducting passage element 38. The heat conducting passage element 38 may be a rod of a highly heat conducting metal or of a composite material comprising chiefly carbon graphite. Preferably, however, the heat conducting passage element 38 (e.g., a heat pipe) has a negligibly low resistance to heat conduction. In an embodiment shown in FIG. 2, the heat radiator 40 comprises a number of heat-radiating fins 42 provided at an end of the heat conducting passage element 38, and a cooling fan 44 is provided on the upper side of the heat-radiating fins 42.

Referring to FIG. 1, the housing 30 has a place, or location, 46 for holding the heat radiator 40, and ventilation holes 48 are formed in the top wall and in the bottom wall of the housing 30 at the holding place 46. It is desired that the holding place 46 is selected at a portion along the outer circumference or periphery of the housing 30. In particular, a corner of the housing 30 is used as the holding place 46. This is because, even when a portion along the outer circumference or a corner of the housing 30 is selected as a place for holding the heat radiator 40, such a portion does not, usually, impose a great limitation on the freedom for designing the electronic equipment as a whole. When a place for holding the heat radiator 40 can be easily obtained inside the housing from the design requirement of the electronic equipment, however, the heat radiator 40 may be held in such a portion as a matter of course. Furthermore, the highly sophisticated electronic package 34 and the holding place 46 may be separated away from each other by a relatively large distance. By extending the heat conducting passage element 38 along a suitable space, however, the heat conducting plate element 36 and the heat radiator 40 can be connected together.

As described before, it is not allowed to maintain a space for installing a large heat radiator having a large heat-radiating capacity in the vicinities of a place where the highly sophisticated electronic package 34 is mounted. According to the heat-radiating system of the present invention, however, the heat radiator 40 can be installed even on a place remote from a place where the highly sophisticated electronic package 34 is mounted. This makes it possible to mount the heat radiator 40 having a large heat-radiating capacity. According to the cooling system of the present invention, therefore, the highly dense electronic package 34 is efficiently cooled.

The heat conducting passage element 38 can be coupled by forming a bore in the heat conducting plate element 36 and inserting an end of the heat conducting passage element 38 into the bore. In this case, in order to guarantee good conduction of heat from the heat conducting plate element 36 to the heat conducting passage element 38, it is desired to fill a gap between the bore and the end of the heat conducting passage element 38 with an adhesive having good thermal conductivity. The heat conducting passage element 38 that is formed of a metal can be coupled to the heat conducting plate element 36 by low-temperature brazing or soldering. The heat-radiating fins 42 can also be attached to the heat conducting passage element 38 by using an adhesive having good thermal conductivity, or by low-temperature brazing or soldering.

According to the constitution shown in FIGS. 1 and 2, the cooling fan 44 is mounted on the heat radiator 40 itself. It is, however, also allowable to mount the cooling fan 44 on the top wall or on the bottom wall of the housing 30.

Figure 3:
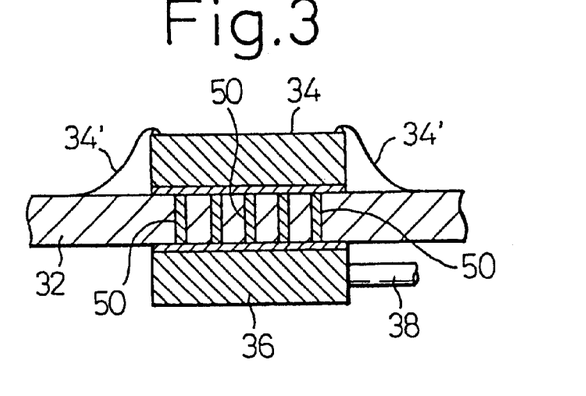
FIG. 3 is a sectional view illustrating an example where a heat conducting plate element used for the cooling system of the present invention is applied to an electronic package of a different type.

Referring to FIG. 3, the highly sophisticated electronic package 34 of the TCP (tape carrier package) type is mounted on the circuit board 32. In the high density electronic package of this type, flexible tapes 34' for holding many lead wires extend from all four sides of the top surface side of the electronic package 34, and the lead wires are joined to the pads on the circuit board 32 in a state of being held by the flexible tapes 34'.

Therefore, it is not allowed to directly attach the heat conducting plate element 36 onto the high density electronic package 34 of the TCP type. In this case and as shown in FIG. 3, the heat conducting plate element 36 is attached to the back side of the circuit board 32 and is connected to the highly sophisticated electronic package 34 through thermal vias 50. In further detail, the thermal vias 50 are formed by forming many through holes in the circuit board 32 and by filling the through holes with a material having good thermal conductivity. Heat is conducted from the highly dense electronic package 34 to the heat conducting plate element 36 through the thermal vias 50. Preferably in this case, the highly dense electronic package 34 and the heat conducting plate element 36 are adhered to the circuit board 32 by using an adhesive or a filler having good thermal conductivity.

Figure 4:
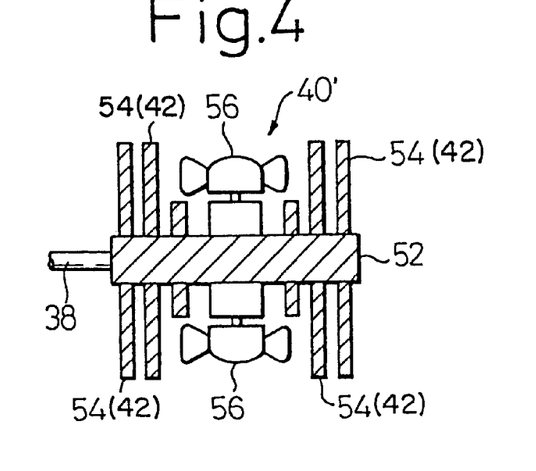
FIG. 4 is a lateral sectional view of a heat radiator of a different type used for the cooling system of the present invention, which is taken along the cross-section line 44 in FIG. 5.
Figure 5:
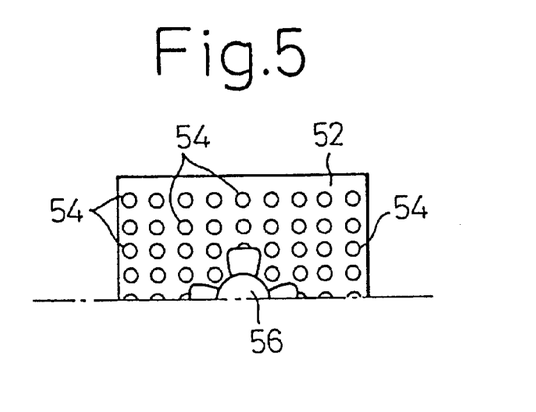
FIG. 5 is a plan view of the radiator of FIG. 4 and illustrates only a half portion along the cross-section line.

Referring to FIGS. 4 and 5, the heat radiator 40 according to another embodiment is denoted by reference numeral 40'. The heat radiator 40' is constituted by a heat conducting plate element 52 connected to an end of the heat conducting passage element 38, a number of heat radiating pin elements 54 provided on both surfaces of the heat conducting plate element 52, and cooling fans 56 provided on both sides of the heat conducting plate 52 at central portions thereof. The heat-conducting plate element 52 and the heat-radiating pin elements 54 are made of the same material as the heat conducting plate element 36. The heat radiator 40' in which the cooling fans 56 are provided on both surfaces of the heat conducting plate element 54 has an advantage in that even if one cooling fan 56 becomes defective, the cooling effect is maintained to some extent by the other cooling fan 56. Even the heat radiator 40 shown in FIG. 2 makes it possible to obtain the same effect by providing the cooling fan on the lower side of the heat-radiating fins 42.

Figure 6:
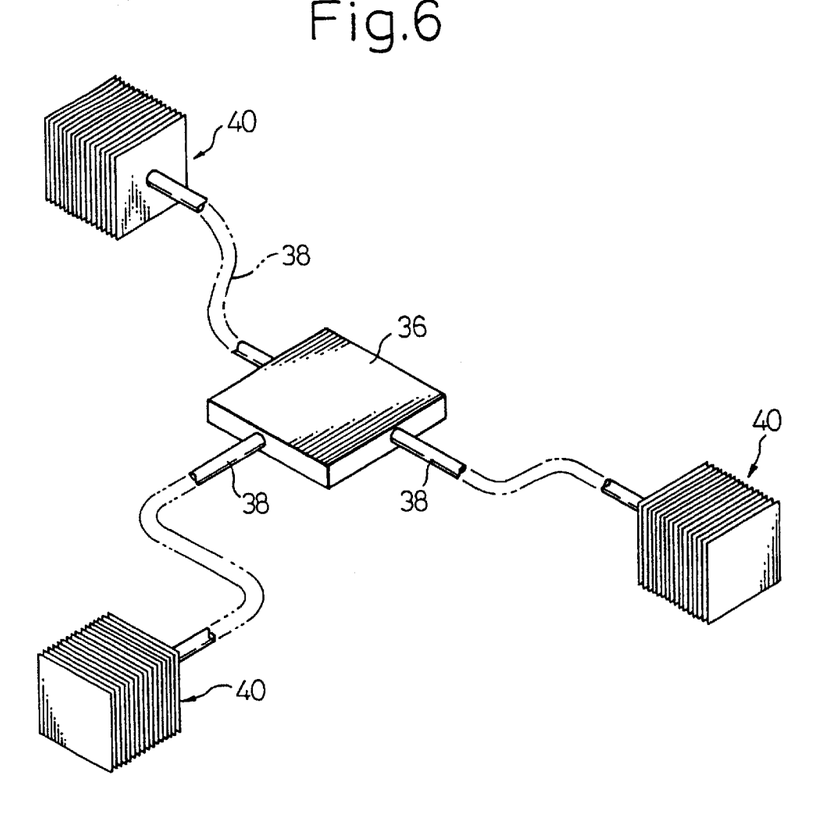
FIG. 6 is a perspective view schematically illustrating a cooling system constituted according to another embodiment of the present invention.
Figure 7:
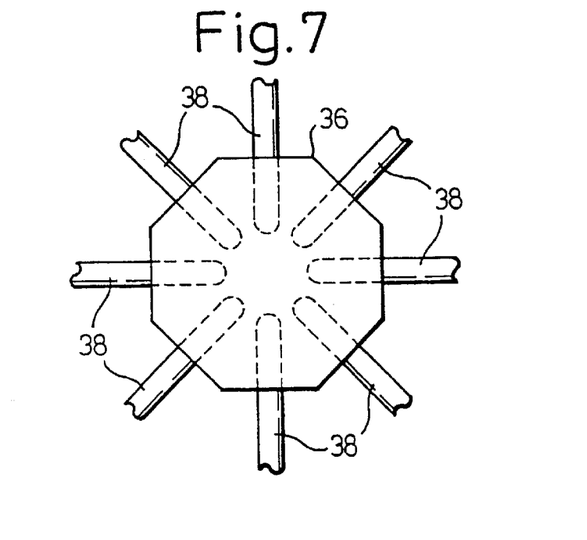
FIG. 7 is a partial planar view illustrating an example of a heat conducting plate element of an octagonal (polyhedron) configuration; with a plurality of heat conducting passage elements extending from the heat conducting plate element of the embodiments of FIGS. 1 and 6.

Referring to FIG. 6, three heat conducting passage elements 38 extend from the heat conducting plate element 36 attached onto the highly dense electronic package, and the heat radiators 40 are attached to the ends of the heat conducting passage elements 38. That is, three heat radiators 40 are connected to the heat conducting plate element 36 through the heat conducting passage elements 38. This embodiment is particularly suited to a case where it is not allowed to obtain a space large enough for holding a large heat radiator having a large heat-radiating capacity at one place along the outer circumference of the housing 30, but it is allowed to obtain relatively narrow spaces at a plurality of places along the outer circumference of the housing 30. The embodiment shown in FIG. 6 is also suited for a case where the heat radiators 40 radiate the heat by being naturally cooled by the air without using the cooling fan 44. This is because, when no cooling fan 44 is used, the total heat-radiating capacity can be increased by providing the heat radiators 40 in a plural number, even though each heat radiator 40 individually may have a decreased heat-radiating capacity. Moreover, the embodiment shown in FIG. 6 can be suitably employed even if an ultra-highly sophisticated electronic package that generates very large amounts of heat were developed in the future. When a single heat conducting plate element 36 is to be connected to five or more heat radiators 40, it is desired that the heat conducting plate element 36 has a planar shape which may be an orthopolygonal shape having five or more sides. When, for example, the heat conducting plate element 36 is to be connected to eight heat radiators 40, it is desired that the heat conducting plate element 36 has an orthooctagonal shape as shown in FIG. 7. According to this constitution, the heat can be uniformly absorbed from the whole heat conducting plate element 36.

Figure 8:
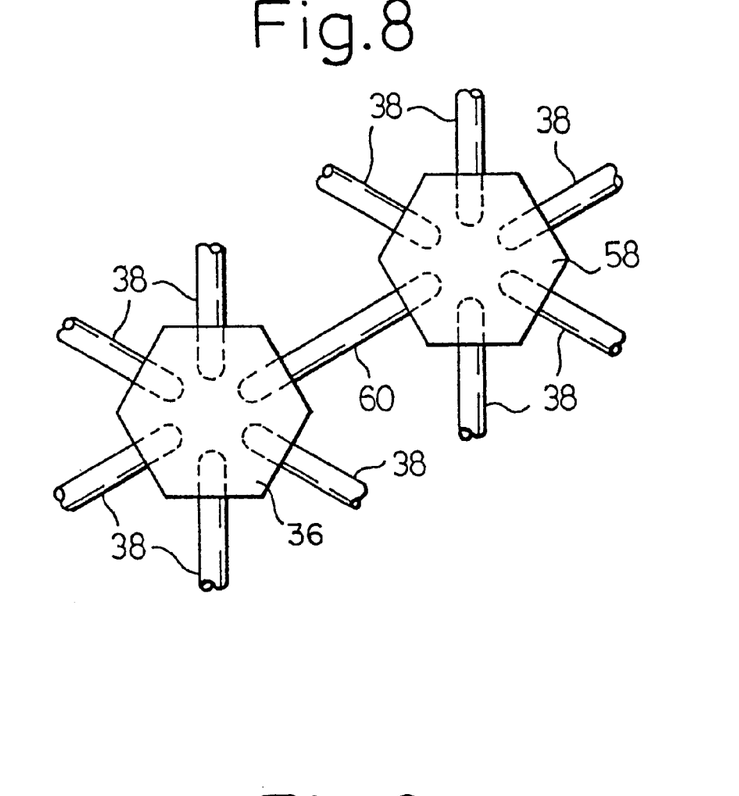
FIG. 8 is a partial perspective view illustrating an example where a relay heat conducting plate element is coupled to a heat conducting plate element as in FIG. 6.

When spaces for holding many (i.e., a large number of) heat radiators 40 are available along the outer circumference of the housing 30 but it is difficult to extend the heat conducting passage elements 38 from a single heat conducting plate element 36 to such a large number of heat radiators 40, a relay heat conducting plate 58 may be provided as shown in FIG. 8. In further detail and with reference to FIG. 8, the heat conducting plate element 36 is attached onto the highly sophisticated electronic package but the relay heat conducting plate element 58 is suspended in the air or is supported by another portion. In the embodiment of FIG. 8, the heat conducting plate element 36 and the relay heat conducting plate element 58 both have an orthohexagonal shape. The relay heat conducting plate element 58 is connected to the heat conducting plate element 36 through a heat conducting passage element 60 which is constituted in the same manner as the heat conducting passage element 38. The heat conducting passage elements 38 extending from the-heat conducting plate element 36 are connected to respective heat radiators, and the heat conducting passage elements 38 extending from the relay heat co element 58 are also connected to respective heat radiators. According to this constitution, or arrangement the single heat conducting plate element 36 can be connected to ten heat radiators. Therefore, the embodiment shown in FIG. 8 is particularly useful for a highly sophisticated electronic package that generates a considerable amount of heat. It is further allowable to connect another relay heat conducting plate element to at least one of the heat conducting plate element 36 and the relay heat conducting conducting plate element 58 by a further, respective heat conducting passage element 38 (and thus corresponding to the heat conducting passage element 60).

Figure 9:
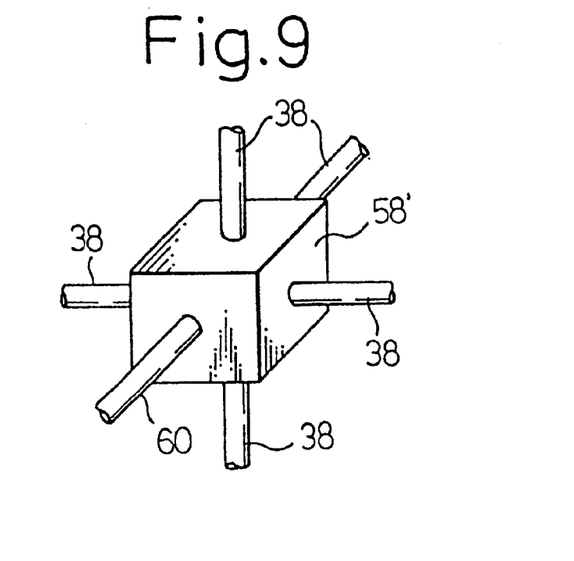
FIG. 9 is a partial perspective view illustrating a relay heat conducting block element instead of the relay heat conducting plate element shown in FIG. 8.

FIG. 9 illustrates an embodiment modified from the embodiment of FIG. 8. In this modified embodiment, a relay heat conducting block element 58' is used instead of the relay heat conducting plate element 58. The relay heat conducting block element 58' is connected to the heat conducting plate element 36 shown in FIG. 8 through the heat conducting passage element 60, and the heat conducting passage elements 38 extending from the relay heat conducting block element 58' are connected to respective heat radiators. The embodiment shown in FIG. 9 is particularly useful when it is possible to lay the heat conducting passage elements 38 in a three-dimensional manner in the housing 30.

Figure 10:
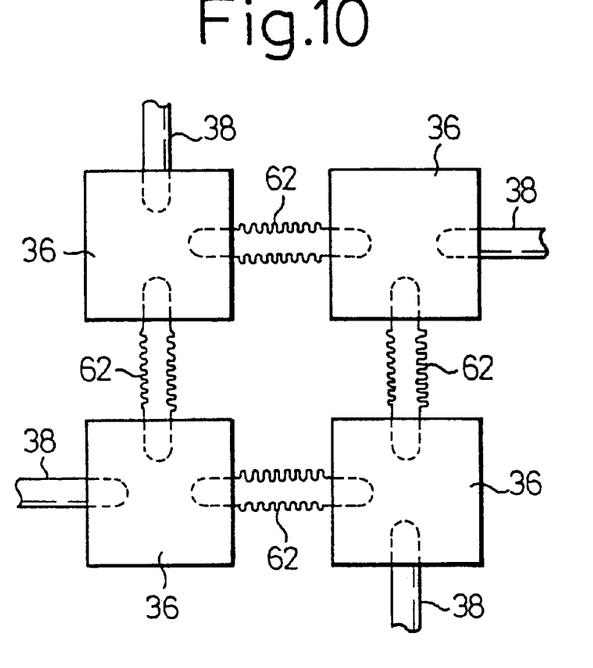
FIG. 10 is a schematic plan view illustrating an example where a plurality of heat conducting plate elements are applied to a plurality of electronic packages.

It is advantageous to arrange a plurality of highly dense electronic packages on a circuit board as shown in FIG. 10 in a manner such that the heat conducting plate elements 36 attached to respective highly sophisticated electronic packages are connected to each other through the heat conducting passage elements 62. This is because the four heat conducting plate elements 36, which are connected together through the heat conducting passage elements 62, play a role which is functionally equivalent to that of a single heat conducting plate element, making it possible to cool the highly sophisticated electronic packages to a nearly uniform temperature despite heat being generated in different amounts among the highly dense electronic packages. In the embodiment of FIG. 10, four highly sophisticated electronic packages are arranged on the circuit board in the same manner as the respective heat conducting plate elements 36. In the diagramed embodiment, each heat conducting plate element 36 is connected to a respective heat radiator through the associated heat conducting passage element 38 extending from the heat conducting plate element 36. Among the four heat conducting plate elements 36, however, at least one heat conducting plate element 36 may be connected to a single heat radiator through the associated heat conducting passage element 38 extending therefrom. As required, however, the heat conducting plate elements 36 may be connected to many heat radiators by using the relay heat conducting plate element 58 or the relay heat conducting block element 58' shown in FIGS. 8 and 9.

In the embodiment shown in FIG. 10, each heat conducting passage element 62 is formed with bellows, as shown. This is because the top surfaces of the highly dense electronic packages are not necessarily flush, due to differences in the height of the four highly sophisticated electronic packages mounted on the circuit board or due to warping of the circuit boards. The bellows, however, exhibit flexibility enabling the positions for attaching the heat conducting passage elements (e.g., heat pipes) to the heat conducting plate elements 36 to be adjusted depending upon the height of the top surfaces of the highly sophisticated electronic packages when the heat conducting plate elements 36 are being secured to the highly sophisticated electronic packages.

Figure 11:
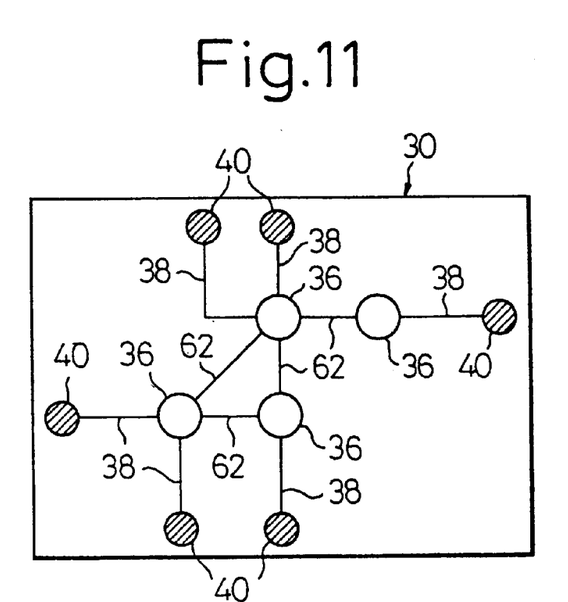
FIG. 11 is a diagram illustrating another constitution at the state when a plurality of heat conducting plate elements are applied to a plurality of electronic packages.

Even when the highly sophisticated electronic packages are mounted on a plurality of relatively spaced-apart portions on the circuit board, the highly dense electronic packages are basically connected together through the heat conducting passage elements in a manner as shown in FIG. 10. FIG. 11 schematically illustrates this constitution, wherein open circles represent heat conducting plate elements 36 and hatched-line circles represent heat radiators or periphery arranged along the outer circumference, of the housing 30. The heat conducting plate elements 36 are connected to each other through the heat conducting passage elements 62, and are connected to their respective heat radiators 40 through the heat conducting passage elements 38 extending therefrom.

Figure 12:
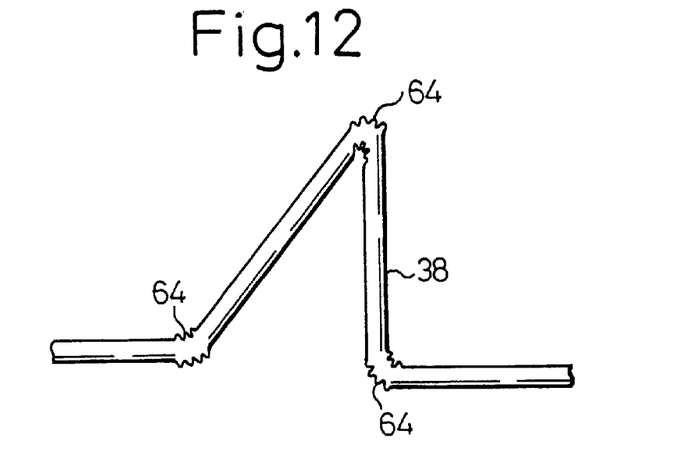
FIG. 12 is a partial plan view illustrating a flexible heat conducting passage element having bellows.

It is desirable to form bellows portions 64 at suitable portions of the heat conducting passage element 38 as shown in FIG. 12. This is because, the element 38 can be easily folded, i.e., angled at the bellows portions 64 and exhibits flexibility when it is being laid down. The element 38 (e.g., heat pipe) may be in the form of a bellows over its entire length.

Figure 13:
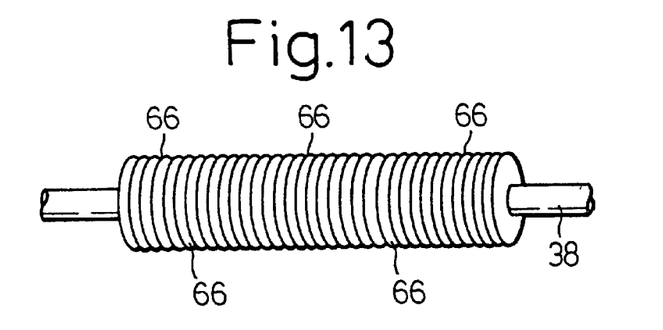
FIG. 13 is a partial perspective view illustrating an example of a heat conducting passage element provided with a plurality of heat-radiating fins.

As shown in FIG. 13, the heat conducting passage element 38 may be provided with heat-radiating fins 66. Such a heat conducting passage element 38 is effective when the heat radiator 40 has a relatively small heat radiating capacity.

Figure 14:
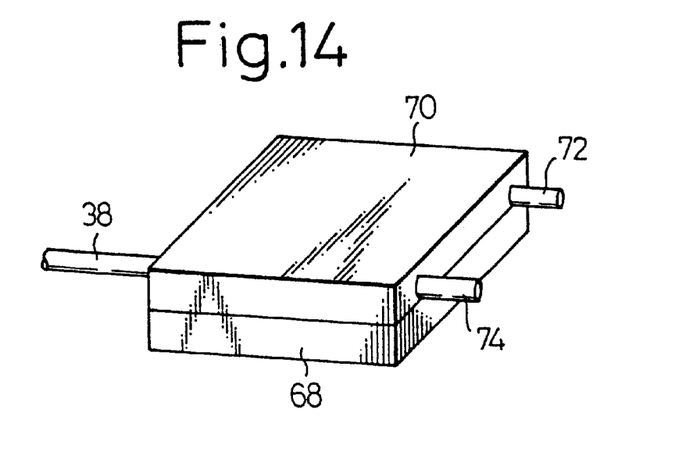
FIG. 14 is a perspective view of a heat radiator of a different type used for the cooling system of the present invention.

In FIG. 14, a further embodiment of the heat radiator 40 is denoted by a reference numeral 40". The heat radiator 40" is constituted by a heat conducting plate element 68 connected to an end of the heat conducting passage element 38, and a cold plate 70 attached to the heat conducting plate element 68. A fluid passage is formed inside the cold plate 70 in a zig-zag manner, and hollow heat conducting passage elements (e.g., pipes) 72 and 74 are connected to both ends of the fluid passage. A cooling fluid such as cooling water is introduced from either one of the hollow element (e.g., pipe) 72 or 74 and is drained from the other hollow element (e.g., pipe), in order to very efficiently remove the heat from the heat conducting plate element 68. Therefore, the heat radiator 40" is suited for cooling a highly dense electronic package that generates heat in very large amounts.

According to the present invention, as will be obvious from the foregoing constitution, the heat radiator is installed in at least one independent holding place (location) formed in advance in the housing of the electronic equipment and does not greatly restrict the freedom for designing the electronic equipment as a whole. Besides, the size of the heat-radiating capacity of the heat radiator can be freely selected depending upon the holding place (location), making it possible to constitute a heat radiator of a high cooling performance to meet the amount of heat generated by the electronic package.

What is claimed is:

1. A cooling system for at least one electronic package disposed in a housing, comprising:

independent heat radiator-holding locations in the housing;

corresponding heat radiators installed in said heat radiator-holding locations;

a heat conducting element thermally coupled to said at least one electronic package in said housing so as to receive heat therefrom; and a first heat conducting passage element, disposed within the housing, connected at a first end to said heat conducting element and at a second end to a relay heat conducting element, and second and third heat conducting passage elements extending respectively from said heat conducting element and from said relay heat conducting element to corresponding said heat radiators.

2. A cooling system according to claim 1, wherein said heat conducting passage element is at least partly formed as a bellows.

3. A cooling system according to claim 1, wherein said heat conducting passage element is formed substantially throughout an entire length thereof as a bellows.

4. A cooling system according to claim 1, wherein said first, second and third heat conducting passage elements are disposed in a common planar relationship.

5. A cooling system for at least one electronic package disposed in a housing, comprising:

independent heat radiator-holding locations in the housing;

corresponding heat radiators installed in said heat radiator-holding locations;

a heat conducting element thermally coupled to said at least one electronic package in said housing so as to receive heat therefrom; and a first heat conducting passage element, disposed within the housing, connected at a first end to said heat conducting element and at a second end to a relay heat conducting block element and plural second heat conducting passage elements extending respectively from said heat conducting element and said relay heat conducting block element in three-dimensional directions relatively to each other to corresponding said heat radiators.

6. A cooling system according to claim 5, wherein said heat conducting passage element is at least partly formed as a bellows.

7. A cooling system according to claim 5, wherein said heat conducting passage element is formed substantially throughout an entire length thereof as a bellows.

8. A cooling system for at least one electronic package disposed in a housing, comprising:

a heat radiator-holding location in the housing;

a first heat conducting element thermally coupled to said at least one electronic package in said housing so as to receive heat therefrom;

a heat radiator installed in said heat radiator-holding location;

a relay heat conducting element connected through a first heat conducting passage element to the first heat conducting element and through a second heat conducting passage element to the heat radiator.

9. A cooling system according to claim 8, wherein said heat conducting passage element is at least partly formed as a bellows.

10. A cooling system according to claim 8, further comprising:

plural heat radiators installed in corresponding, plural heat radiator-holding locations; and third and fourth heat conducting passage elements respectively connected to the first heat conducting element and the relay heat conducting element at respective first ends thereof and connected at respective second ends thereof to corresponding heat radiators.

11. A cooling system according to claim 8, wherein the first and second heat conducting passage elements are in a common planar relationship.

12. A cooling system for plural electronic packages disposed in a housing, comprising:

a plurality of independent heat radiator-holding locations within the housing and along a periphery of the housing;

a plurality of first and second heat radiators installed respectively in said plurality of independent heat radiator-holding locations;

a heat conducting element coupled to at least one respective electronic package in said housing so as to receive heat therefrom;

a relay heat conducting element; and first heat conducting passage elements, disposed within the housing, connected at corresponding first ends thereof to said heat conducting element and at corresponding second ends thereof, respectively, to said relay heat conducting plate and to corresponding said first heat radiators and conducting heat from the heat conducting element to, respectively, said relay heat conducting plate and said corresponding first heat radiators, and second heat conducting passage elements, connected at corresponding first ends thereof to said relay heat conducting plate and at corresponding second ends thereof, respectively, to corresponding said second heat radiators and conducting heat thereto.

13. A cooling system according to claim 12, wherein each of said first and second heat conducting passage elements is at least partly formed as a bellows.

14. A cooling system according to claim 12, wherein each of said first and second heat conducting passages elements is formed substantially throughout an entire length thereof as a bellows.

15. A cooling system according to claim 12, wherein all of said first and second heat conducting passage elements are disposed in a common planar relationship.

16. A cooling system according to claim 12, wherein the relay heat conducting element comprises a plate element.

17. A cooling system according to claim 12, wherein the relay heat conducting element comprises a block element.

18. A cooling system for at least one electronic package disposed in a housing, comprising:

plural heat radiator-holding locations in the housing;

plural heat radiators installed in said plural heat radiator-holding locations, respectively;

a heat conducting element thermally coupled to said at least one electronic package in said housing so as to receive heat therefrom;

a relay heat conducting block element connected through a first heat conducting passage element to the first heat conducting element; and plural second heat conducting passage elements connected at corresponding first ends thereof respectively to the heat conducting element and to the relay heat conducting block element and extending in respective ones of different three-dimensional directions, relatively to each other, and connected at corresponding second ends thereof to respective said heat radiators.

19. A cooling system according to claim 18, wherein each said heat conducting passage element is at least partly formed as a bellows.

20. A cooling system according to claim 18, wherein each said heat conducting passage element is formed substantially throughout an entire length thereof as a bellows.

21. A cooling system for plural electronic packages disposed in a housing, comprising:

a plurality of independent heat radiator-holding locations within the housing and along a periphery of the housing;

a plurality of heat radiators installed respectively in said plurality of independent heat radiator-holding locations;

a heat conducting element coupled to at least one respective electronic package in said housing so as to receive heat therefrom;

a relay heat conducting block;

first heat conducting passage elements, disposed within the housing, connected at corresponding first ends thereof to said heat conducting element and at corresponding second ends thereof, respectively, to said relay heat conducting block and to corresponding said first heat radiators and conducting heat from the heat conducting element, respectively, to said corresponding first heat radiators and second heat conducting passage elements, connected at corresponding first ends thereof to said relay heat conducting block and at corresponding second ends thereof, respectively, to corresponding said second heat radiators and conducting heat thereto; and the plurality of heat conducting passage elements extending in respective ones of different three-dimensional directions relatively to each other.

22. A cooling system according to claim 21, wherein each said heat conducting passage element is at least partly formed as a bellows.

23. A cooling system according to claim 21, wherein each said heat conducting passage element is formed substantially throughout an entire length thereof as a bellows.

* * * * *